(12) United States Patent
Chan et al.

(10) Patent No.: US 12,389,727 B2
(45) Date of Patent: Aug. 12, 2025

(54) PACKAGE STRUCTURE AND MANUFACTURING METHOD THEREOF

(71) Applicant: AUO Corporation, Hsin-Chu (TW)

(72) Inventors: Fu-Wei Chan, Hsin-Chu (TW); Kuan-Hsun Chen, Hsin-Chu (TW); Yi-Hsin Lin, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 455 days.

(21) Appl. No.: 18/062,603

(22) Filed: Dec. 7, 2022

(65) Prior Publication Data

US 2023/0246142 A1    Aug. 3, 2023

(30) Foreign Application Priority Data

Jan. 28, 2022   (TW) .................................. 111104141

(51) Int. Cl.
| | |
|---|---|
| *H10H 20/853* | (2025.01) |
| *H01L 25/075* | (2006.01) |
| *H10H 20/854* | (2025.01) |
| *H10H 20/01* | (2025.01) |

(52) U.S. Cl.
CPC ....... *H10H 20/853* (2025.01); *H01L 25/0753* (2013.01); *H10H 20/854* (2025.01); *H10H 20/0362* (2025.01)

(58) Field of Classification Search
CPC . H01L 25/075; H01L 25/0753; H01L 25/167; H01L 23/28–3192; H01L 21/56–568; H10H 29/10; H10H 29/14; H10H 29/142; H10H 29/852; H10H 29/853; H10H 20/0362; H10K 59/10; H10K 59/12; H10K 59/18; H10K 59/19; H05K 3/284; H05K 2201/10106
See application file for complete search history.

(56) References Cited

U.S. PATENT DOCUMENTS

| | | | |
|---|---|---|---|
| 6,602,790 B2 | 8/2003 | Kian et al. | |
| 11,145,797 B1 * | 10/2021 | Torrents Abad | ........ H01L 24/81 |
| 12,278,226 B2 * | 4/2025 | Hong | ........... H10H 29/142 |

(Continued)

FOREIGN PATENT DOCUMENTS

| | | | | |
|---|---|---|---|---|
| CN | 102237350 A | * | 11/2011 | ............... F21K 9/20 |
| CN | 102544325 A | * | 7/2012 | ........... H10H 20/857 |

(Continued)

*Primary Examiner* — Scott B Geyer
(74) *Attorney, Agent, or Firm* — WPAT, PC

(57) ABSTRACT

A package structure includes a circuit substrate, a light emitting diode array, a first encapsulant, and a sealant. The circuit substrate includes a top surface and a side surface of the circuit substrate. The light emitting diode array is disposed on the top surface of the circuit substrate. The first encapsulant is disposed above the circuit substrate. The first encapsulant includes a main portion and an extension portion, in which the main portion of the first encapsulant is disposed parallel to the top surface of the circuit substrate, and the extension portion of the first encapsulant extends to the side surface of the circuit substrate. The sealant is disposed below the extension portion of the first encapsulant, and the sealant contacts the first encapsulant and the circuit substrate. The first encapsulant and the sealant together form a coplanar surface.

20 Claims, 14 Drawing Sheets

(56) References Cited

U.S. PATENT DOCUMENTS

| | | | |
|---|---|---|---|
| 12,322,735 B2* | 6/2025 | Chan | H01L 25/13 |
| 2001/0022021 A1* | 9/2001 | Maekawa | H05K 3/3442 |
| | | | 29/841 |
| 2008/0224161 A1* | 9/2008 | Takada | H10H 20/8581 |
| | | | 361/813 |
| 2011/0089438 A1* | 4/2011 | Steijer | H01L 25/167 |
| | | | 257/82 |
| 2011/0227108 A1* | 9/2011 | Tetz | H10H 20/858 |
| | | | 257/E33.061 |
| 2012/0153313 A1* | 6/2012 | Yokotani | H10H 20/857 |
| | | | 257/E33.056 |
| 2013/0001623 A1* | 1/2013 | Wen | H10H 20/853 |
| | | | 257/E33.059 |
| 2013/0187175 A1* | 7/2013 | Hwu | H01L 25/0753 |
| | | | 257/E33.072 |
| 2013/0193592 A1* | 8/2013 | Peil | H10F 77/496 |
| | | | 257/791 |
| 2015/0008462 A1* | 1/2015 | Weng | H10H 20/84 |
| | | | 438/27 |
| 2015/0097199 A1 | 4/2015 | Chen et al. | |
| 2016/0225962 A1* | 8/2016 | Manion | H10H 20/854 |
| 2017/0005238 A1* | 1/2017 | Hung | H10H 20/851 |
| 2017/0040504 A1 | 2/2017 | Chen et al. | |
| 2017/0244010 A1* | 8/2017 | Kim | H10H 20/018 |
| 2018/0061728 A1* | 3/2018 | Chen | H10K 50/8426 |
| 2018/0233635 A1 | 8/2018 | Chen et al. | |
| 2019/0067539 A1* | 2/2019 | Kwak | H10H 20/83 |
| 2019/0140144 A1* | 5/2019 | Omori | H01L 25/0753 |
| 2019/0296198 A1 | 9/2019 | Chen et al. | |
| 2019/0355884 A1* | 11/2019 | Pan | H10H 20/853 |
| 2020/0075559 A1* | 3/2020 | Lee | H01L 25/0753 |
| 2020/0098963 A1* | 3/2020 | Maeda | H01L 25/0753 |
| 2020/0235261 A1* | 7/2020 | Hu | H10H 20/812 |
| 2020/0243731 A1* | 7/2020 | Kang | H10H 20/8506 |
| 2021/0151640 A1 | 5/2021 | Chen et al. | |
| 2021/0167245 A1* | 6/2021 | Aas | H10H 20/814 |
| 2021/0183837 A1* | 6/2021 | Shin | G02F 1/13336 |
| 2021/0193635 A1 | 6/2021 | Lee et al. | |
| 2021/0375833 A1* | 12/2021 | Lee | H10H 20/857 |
| 2021/0376202 A1* | 12/2021 | Hung-Wen | H10H 20/84 |
| 2022/0084994 A1 | 3/2022 | Shin | |
| 2022/0093819 A1* | 3/2022 | Chen | C09J 5/06 |
| 2022/0199594 A1* | 6/2022 | Shin | H01L 25/0753 |
| 2022/0262995 A1 | 8/2022 | Li et al. | |
| 2022/0302358 A1* | 9/2022 | Ikeda | G09F 9/00 |
| 2022/0328459 A1* | 10/2022 | Wu | H10H 20/852 |
| 2022/0352048 A1* | 11/2022 | Fachmann | H01L 21/78 |
| 2023/0012204 A1 | 1/2023 | Chen et al. | |
| 2023/0109954 A1* | 4/2023 | Huang | H10H 20/01 |
| | | | 438/22 |
| 2023/0134502 A1* | 5/2023 | Wang | H10H 20/01 |
| | | | 257/79 |
| 2024/0162394 A1* | 5/2024 | Li | H10H 20/852 |
| 2024/0194838 A1* | 6/2024 | Li | H10H 20/01 |

FOREIGN PATENT DOCUMENTS

| | | | | |
|---|---|---|---|---|
| CN | 106024650 A | * | 10/2016 | H10H 20/852 |
| CN | 106505134 A | * | 3/2017 | H10H 20/853 |
| CN | 108847439 A | * | 11/2018 | H10H 20/857 |
| CN | 112071969 A | * | 12/2020 | H10H 20/855 |
| CN | 113451486 A | | 9/2021 | |
| CN | 113555326 A | * | 10/2021 | H01L 23/49805 |
| CN | 114447189 A | * | 5/2022 | H01L 25/0753 |
| CN | 114613799 A | * | 6/2022 | H01L 25/13 |
| EP | 4141527 A1 | | 3/2023 | |
| JP | 2014-048322 A | | 3/2014 | |
| JP | 2019197906 A | | 11/2019 | |
| JP | 2022104258 A | * | 7/2022 | G09F 9/30 |
| KR | 20170072483 A | | 6/2017 | |
| TW | 201431114 A | | 8/2014 | |
| WO | WO-2016129658 A1 | * | 8/2016 | H01L 25/0753 |
| WO | WO2021/118268 A1 | | 6/2021 | |
| WO | WO2021/230509 A1 | | 11/2021 | |
| WO | WO-2022149418 A1 | * | 7/2022 | H10H 20/854 |

* cited by examiner

PACKAGE STRUCTURE AND MANUFACTURING METHOD THEREOF

CROSS-REFERENCE TO RELATED APPLICATION

This application claims priority to Taiwan Application Serial Number 111104141, filed Jan. 28, 2022, which is herein incorporated by reference.

BACKGROUND

Field of Invention

The present disclosure is relates to a package structure and a manufacturing method for the package structure.

Description of Related Art

With the technological development of electronic products, the quality requirements for display panels are getting higher and higher. The processes of the display panel include sealing, cutting, etching, cleaning operations, and so on. If each process could not be appropriately treated, the luminous efficiency of light emitting diodes (LEDs) may be affected, thereby affecting the quality of the display panel For example, if the black encapsulant covering LEDs could not be effectively removed, the luminous efficiency of the LEDs would be reduced. If the side edge of the encapsulant is pulled during the cleaning process, the side edge would be peeled (degumming), which causes damage to the display area (effective area) of the display panel.

SUMMARY

In order to solve the above-mentioned problems and overcome the deficiencies of the prior art, the purpose of the present disclosure is to provide a packaging structure and a manufacturing method of the packaging structure. The present disclosure could improve the above-mentioned problems and prevent the display panel from being damaged due to incomplete cleaning or degumming.

The present disclosure provides a package structure including a circuit substrate, a light emitting diode array, a first encapsulant, and a sealant. The circuit substrate includes a top surface and a side surface of the circuit substrate. The light emitting diode array is disposed on the top surface of the circuit substrate. The first encapsulant is disposed above the circuit substrate, the first encapsulant includes a main portion and an extension portion, in which the main portion is disposed parallel to the top surface, and the extension portion extends from the main portion to the side surface of the circuit substrate. The sealant is disposed below the extension portion of the first encapsulant, and the sealant contacts the first encapsulant and the circuit substrate. The first encapsulant forms a coplanar surface in community with the sealant.

In some embodiments, the first encapsulant includes 5~20 wt % of black particles.

In some embodiments, a cutting profile of the first encapsulant and a cutting profile of the sealant form a continuous structure on the coplanar surface.

In some embodiments, a material of the sealant includes acrylic resin.

In some embodiments, an optical density of the sealant is greater than 3.

In some embodiments, the main portion of the first encapsulant forms the coplanar surface in community with the extension portion of the first encapsulant and the sealant.

In some embodiments, the main portion of the first encapsulant forms the coplanar surface in community with the sealant, and the extension portion of the first encapsulant is between the coplanar surface and the side surface of the circuit substrate.

In some embodiments, the package structure further includes a second encapsulant covering the light emitting diode array and the first encapsulant.

In some embodiments, the first encapsulant forms the coplanar surface in community with the sealant and the second encapsulant.

In some embodiments, a distance between the coplanar surface and the side surface of the circuit substrate is in a range from 5 μm to 15 μm.

In some embodiments, a distance between the coplanar surface and the side surface of the circuit substrate is in a range from 45 μm to 55 μm.

In some embodiments, the light emitting diode array includes a light emitting diode, and a distance between a top surface of the main portion of the first encapsulant and a top surface of the light emitting diode is in a range from 5 μm to 10 μm.

In some embodiments, the light emitting diode array includes a light emitting diode. The light emitting diode includes a bonding pad between the light emitting diode and the circuit substrate, and a height position of the main portion of the first encapsulant is substantially the same as a height position of the bonding pad.

The present disclosure provides a manufacturing method for a package structure. The manufacturing method includes the following operations. A first encapsulant is formed on a circuit substrate and a light emitting diode array, the light emitting diode array is disposed on the circuit substrate, the circuit substrate includes a top surface and a side surface, the first encapsulant includes a main portion and an extension portion, the main portion is disposed parallel to the top surface, and the extension portion extends from the main portion to the side surface. A sealant is formed on the side surface of the circuit substrate, the sealant contacts the side surface of the circuit substrate and the extension portion of the first encapsulant. An etching operation is performed to mostly remove the first encapsulant light above the emitting diode array. A dry cleaning operation is performed to completely remove an ashing portion of the first encapsulant above the light emitting diode array and expose a top surface of the light emitting diode array. A second encapsulant is formed on the light emitting diode array and the first encapsulant, in which the first encapsulant is between the light emitting diode array.

In some embodiments, the manufacturing method for the package structure further including: performing a cutting operation after forming the sealant on the side surface of the circuit substrate, and thereby the main portion of the first encapsulant forms a coplanar surface in community with the sealant.

In some embodiments, the manufacturing method for the package structure further including: performing a cutting operation after forming the sealant on the side surface of the circuit substrate, and thereby the main portion of the first encapsulant forms a coplanar surface in community with the extension portion of the first encapsulant, and the sealant.

In some embodiments, the manufacturing method for the package structure further including: performing a cutting operation after forming the second encapsulant on the light emitting diode array and on the first encapsulant between the light emitting diode array, and thereby the main portion of the first encapsulant forms a coplanar surface in community with the second encapsulant, the extension portion of the first encapsulant, and the sealant.

In some embodiments, the manufacturing method for the package structure further including: performing a cutting operation after forming the second encapsulant on the light emitting diode array and on the first encapsulant between the light emitting diode array, and thereby the main portion of the first encapsulant forms a coplanar surface in community with the second encapsulant, and the sealant.

In some embodiments, the first encapsulant includes 5~20 wt % of black particles.

In some embodiments, an optical density of the sealant is greater than 3.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
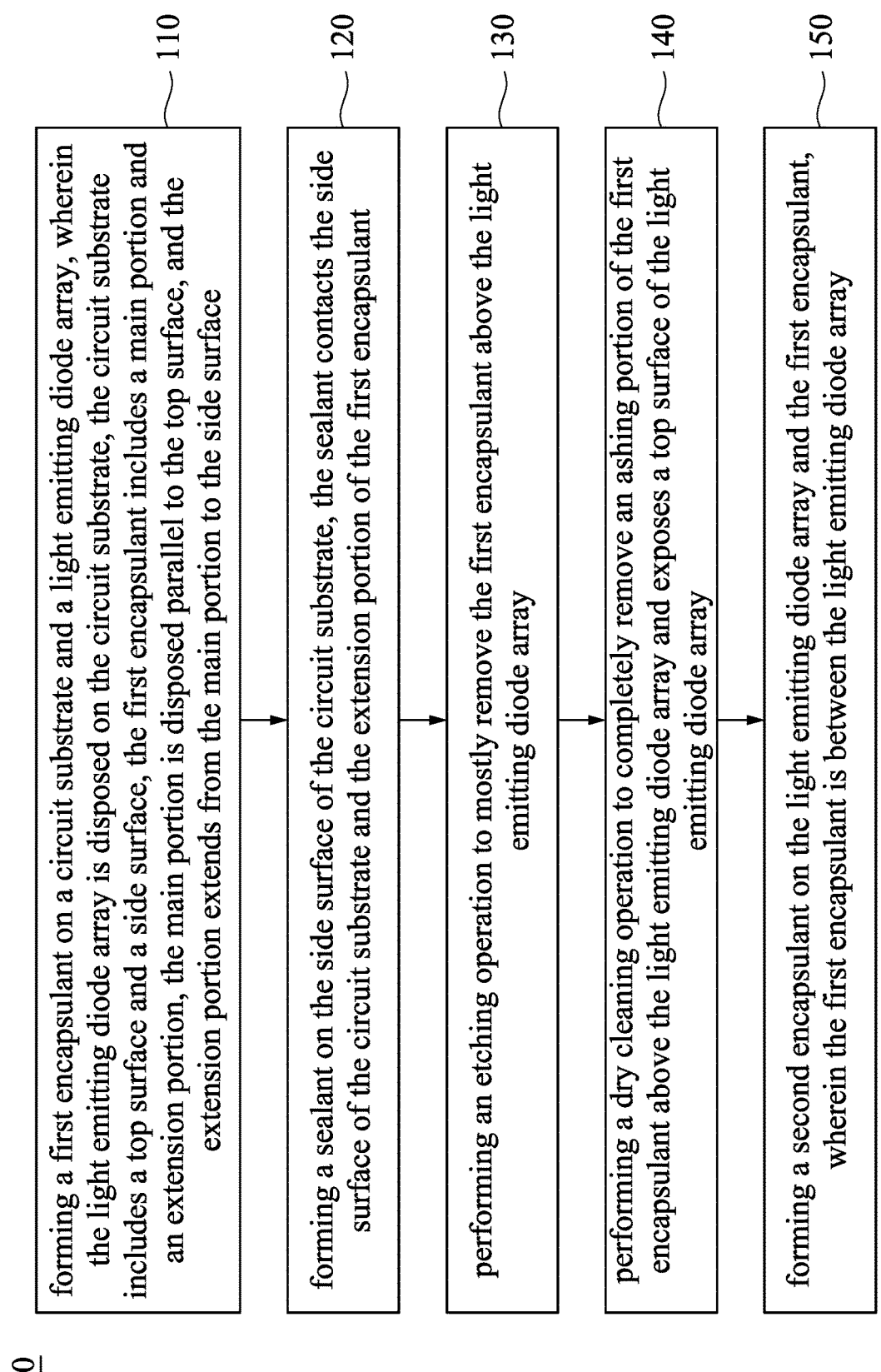
FIG. 1 is a flowchart of a manufacturing method for a package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Although a series of operations or steps are used below to illustrate the methods disclosed herein, the order of these operations or steps should not be construed a limitation of the present disclosure. For example, some operations or steps could be may be performed in a different order and/or concurrently with other steps. Furthermore, not all operations, steps, and/or features must be performed in order to implement embodiments of the present disclosure. Each operation or step herein could include several sub-operations or sub-steps.

The present disclosure provides a manufacturing method for a package structure, please refer to FIG. 1 and FIG. 2A to FIG. 2H. FIG. 1 is a flowchart of a manufacturing method 100 for a package structure in accordance with some embodiments of the present disclosure. The method 100 includes an operation 110 to an operation 150. FIG. 2A to FIG. 2H are cross-sectional views of various forming stages of a package structure 200 in accordance with some embodiments of the present disclosure.

Figure 2A:
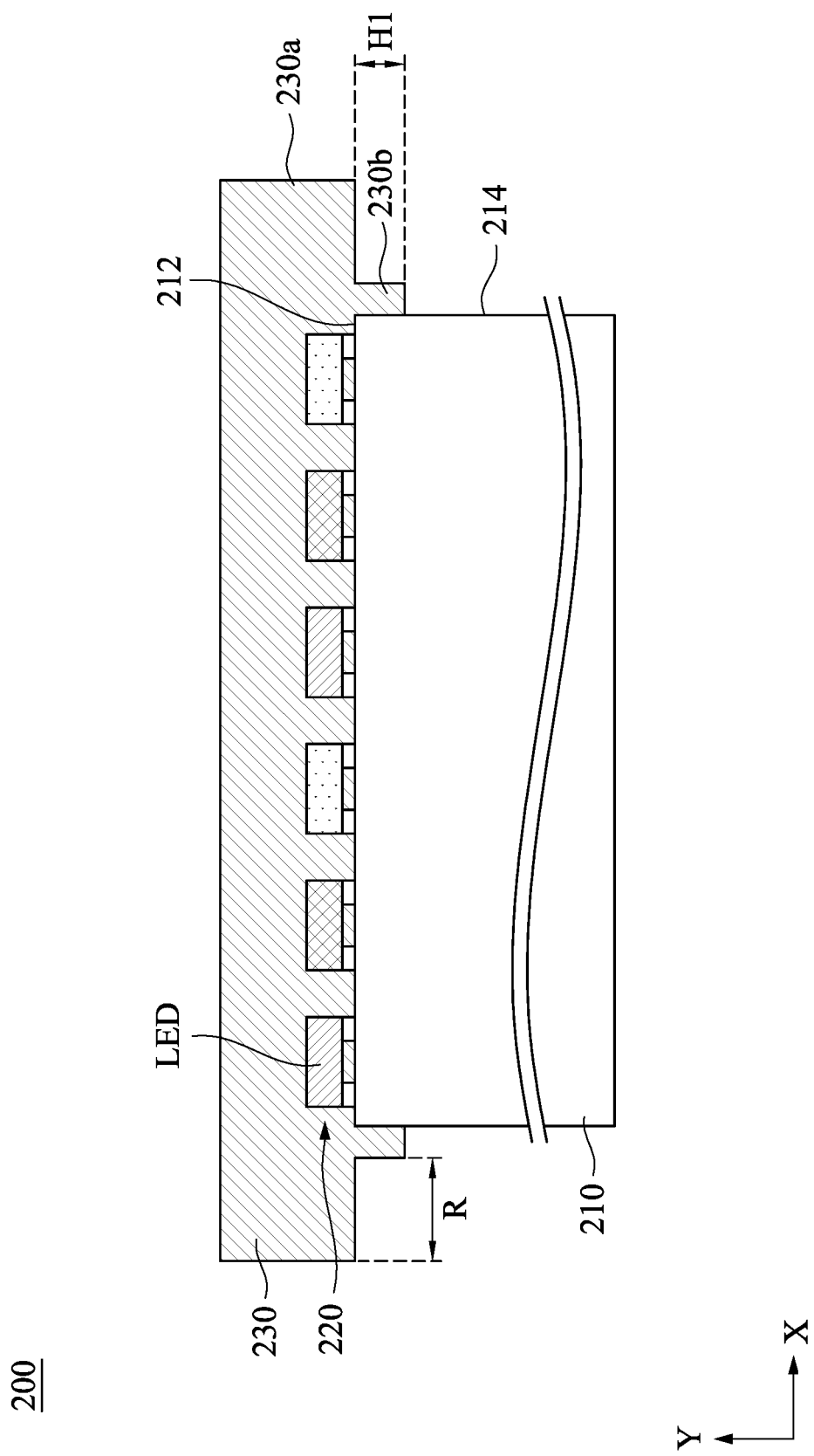
FIG. 2A to FIG. 2H are cross-sectional views of various forming stages of a package structure in accordance with some embodiments of the present disclosure.

Please refer to the operation 110 in FIG. 1 and FIG. 2A. A first encapsulant 230 is formed on a circuit substrate 210 and a light emitting diode array 220. The light emitting diode array 220 is disposed on the circuit substrate 210. The circuit substrate 210 includes a top surface 212 and a side surface 214, the first encapsulant 230 includes a main portion 230a and an extension portion 230b, the main portion 230a of the first encapsulant 230 is disposed parallel to the top surface 212 of the circuit substrate 210, the extension portion 230b of the first encapsulant 230 extends from the main portion 230a to the side surface 214 of the circuit substrate 210. The sides of the first encapsulant 230 have T-shaped structures. Specifically, the main portion 230a of the first encapsulant 230 extends along a direction X, the extension portion 230b of the first encapsulant 230 extends along a direction Y and contacts the side surface 214 of the circuit substrate 210. It is noticed that the main portion 230a of the first encapsulant 230 in the direction X protrudes from the extension portion 230b of the first encapsulant 230. Therefore, the protruding portion could be referred to as a wing region R. The extension portion 230b of the first encapsulant 230 extends downward an amount of a height H1. In some embodiments, the height H1 is in a range from 0 to 200 μm.

In some embodiments, the circuit substrate 210 could be a thin film transistor (TFT) substrate, a microchip (driver chip) substrate, a glass substrate, a polyimide (PI) substrate, or a printed circuit board (PCB). In some embodiments, the light emitting diode array 220 includes a plurality of light emitting diodes (LEDs), micro light emitting diodes (micro LEDs), mini light emitting diodes (mini LEDs), or organic light emitting diodes (organic LEDs, OLEDs).

As shown in FIG. 2A, the first encapsulant 230 is configured to as a light-shielding layer and has a function of absorbing light. Therefore, the first encapsulant 230 also could be referred to as a black encapsulant. In some embodiments, a material of the first encapsulant 230 may include an organic compound, an inorganic compound, other suitable material, or combinations thereof. The organic compound could be, for example, polyacrylic resin, epoxy resin, allyl resin, phenolic resin, polytetrafluoroethylene, polymethyl methacrylate (acrylic), or combinations thereof. The inorganic compound could be, for example, alumina, silicon oxide (silicone), boron oxide, aluminosilicate, borosilicate, or combinations thereof. In some embodiments, the first encapsulant 230 includes 5~20 wt % of the black particles, for example, 8, 10, 12, 15, or 18 wt %. If the proportion of black particles is too low, the first encapsulant 230 may not have the function of absorbing (or shading) light. If the proportion of black particles is too high, after performing the etching operation and the dry cleaning operation of the light emitting diode LED (it will be discussed in FIG. 2D and FIG. 2E below), the first encapsulant 230 may not have positive effect on the luminous efficiency of the light emitting diode LED. In some embodiments, the first encapsulant 230 may be disposed on the circuit substrate 210 and the light emitting diode array 220 by using a lamination process.

Figure 2B:
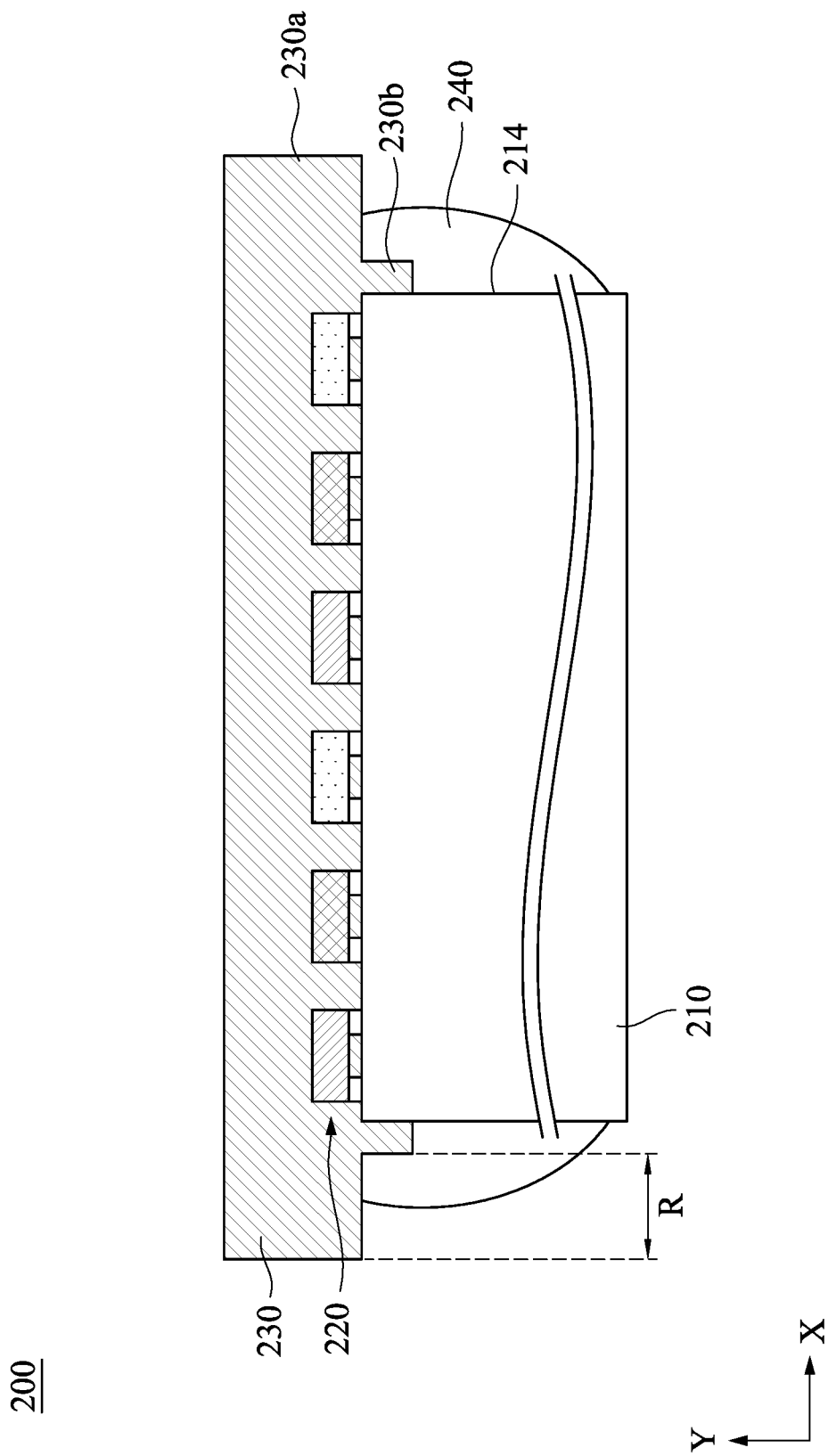

Please refer to the operation 120 in FIG. 1 and FIG. 2B. The sealant 240 is formed on the side surface 214 of the circuit substrate 210. Specifically, the sealant 240 contacts the side surface 214 of the circuit substrate 210 and the extension portion 230b of the first encapsulant 230. More specifically, the sealant 240 further contacts a portion of the wing region R. The sealant 240 surrounds the side surface 214 of the circuit substrate 210. Therefore, the disclosed sealant 240 also could be referred to as a side sealant. In some embodiments, the sealant 240 is formed by using a piezoelectric jet method. The sealant 240 is configured to provide good adhesion such that the circuit substrate 210 and the first encapsulant 230 are tightly bonded without degumming. Since the sealant 240 is disposed below the sealant 240 and the first encapsulant 230 has the function of shading light, the sealant 240 may not be doped with black particles. In some embodiments, an optical density of the sealant 240 is greater than 3. In some embodiments, a material of the sealant 240 may include acrylic resin, such as UV-curing resin.

Figure 2C:
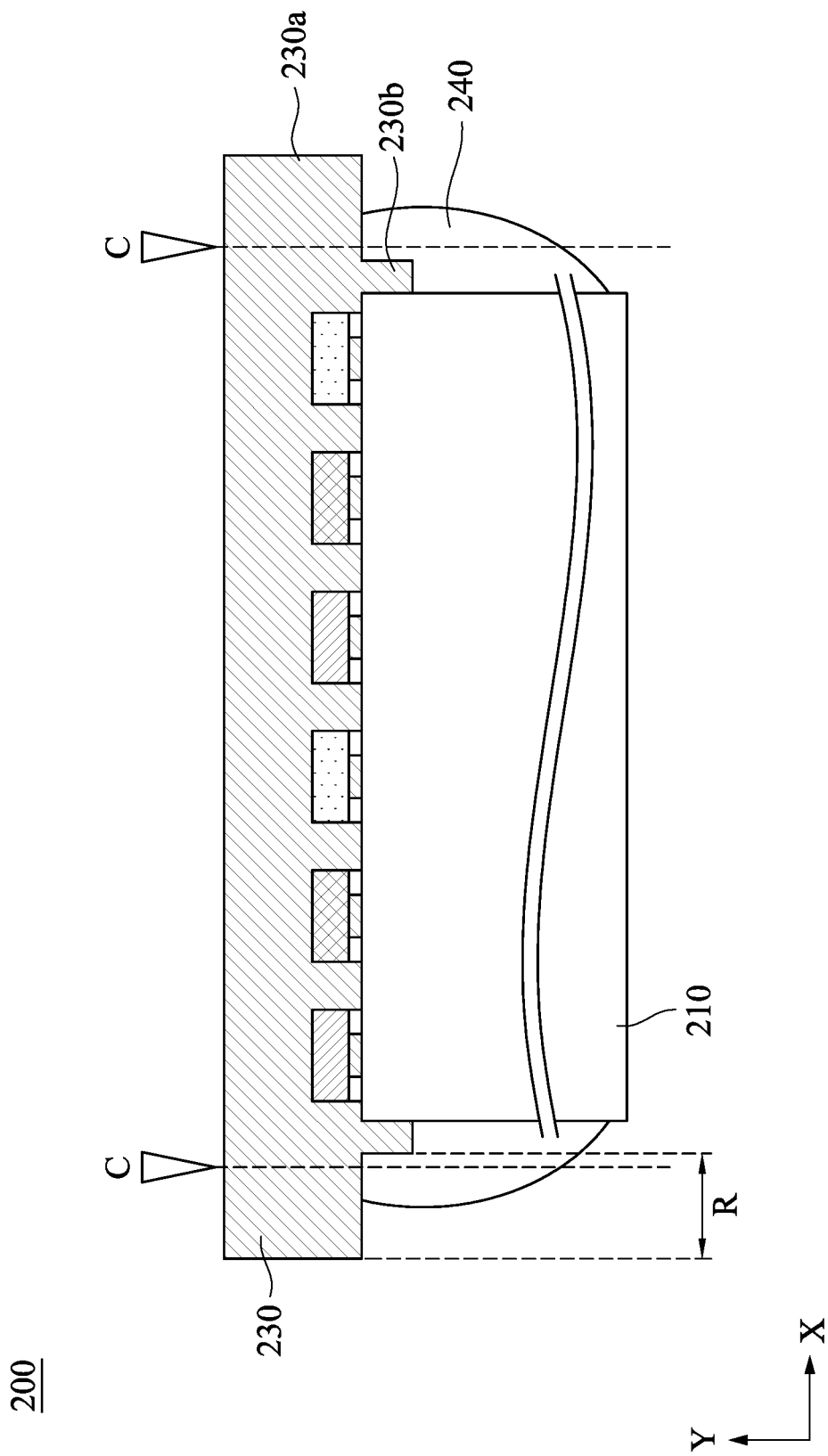
Figure 2D:
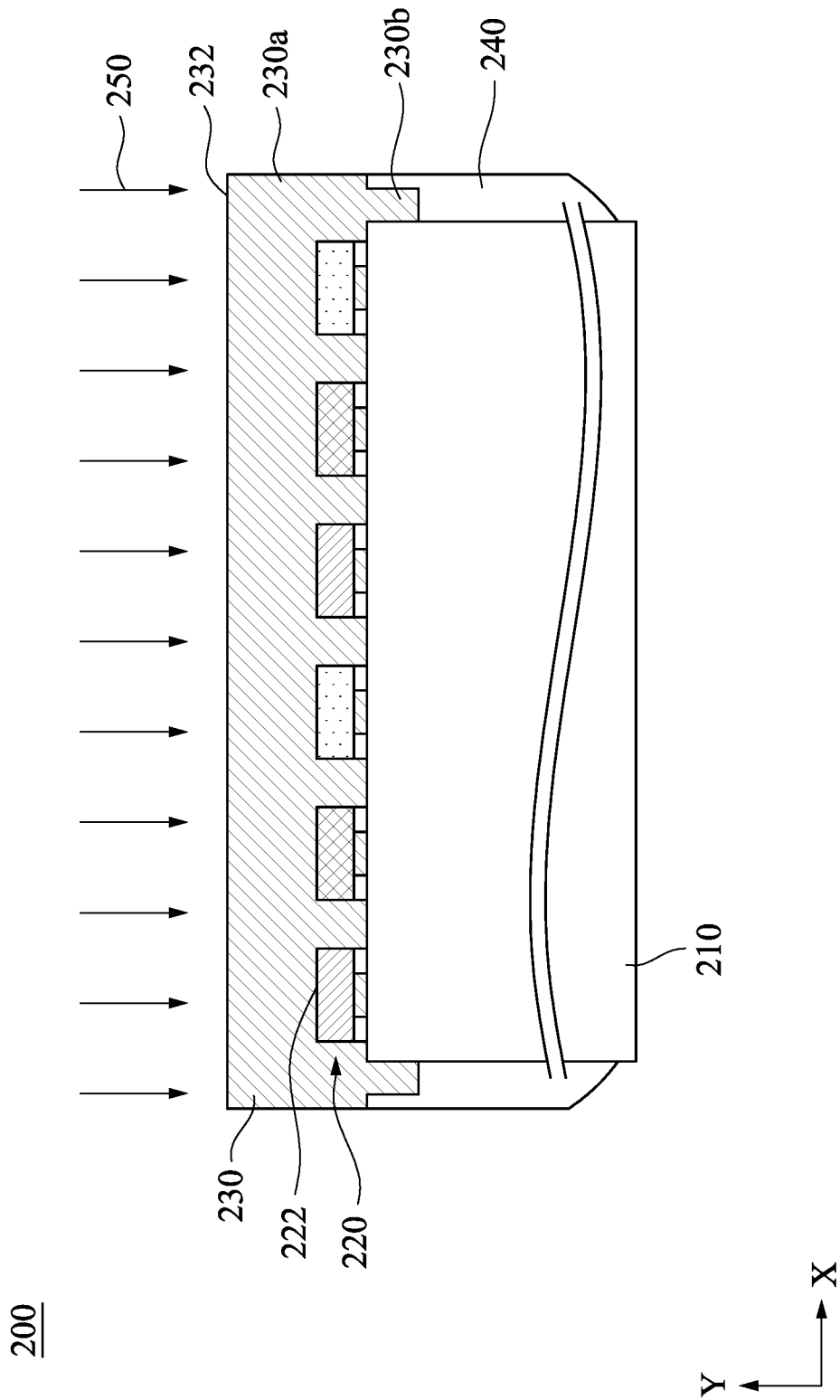

Still refer to FIG. 2B and FIG. 2C. After performing the operation 120 in FIG. 1, performing a cutting operation C such that the main portion 230a of the first encapsulant 230 forms a coplanar surface in community with the sealant 240, as shown in FIG. 2D. Specifically, the coplanar surface is formed by the side surface of the main portion 230a of the first encapsulant 230 and the side surface of the sealant 240. In some embodiments, a cutting profile of the first encapsulant and a cutting profile of the sealant form a continuous structure on the coplanar surface. In some embodiments, the continuous structure may include an undulating structure. In some embodiments, the undulating structure may include an undulating surface and a recess. In some embodiments, an extension direction of the recess is parallel to a cutting direction of the cutting operation C. After the cutting operation C, the sides of the first encapsulant 230 remain T-shaped structures (please refer to FIG. 2D). More specifically, the inverted triangle signs (V) in FIG. 2C represent the cutting positions, and the cutting positions are at the wing region R of the protruding portion of the main portion 230a of the first encapsulant 230, such that the relatively small-sized wing regions R are remained in the package structure 200. On the one hand, since the main portion 230a of the first encapsulant 230 contacts the sealant 240 and form the coplanar surface together, the sealant 240 could provide good adhesion for the first encapsulant 230. On the other hand, the reduced sizes of the wing regions R could prevent the sealant 240 and the first encapsulant 230 from peeling or degumming at the following dry cleaning operation (it will be discussed in FIG. 2E below), thereby avoiding the damage to the display area (or may be referred to as the effective area) of the display panel. The cutting operation C may be, for example, a laser cutting operation.

Figure 2E:
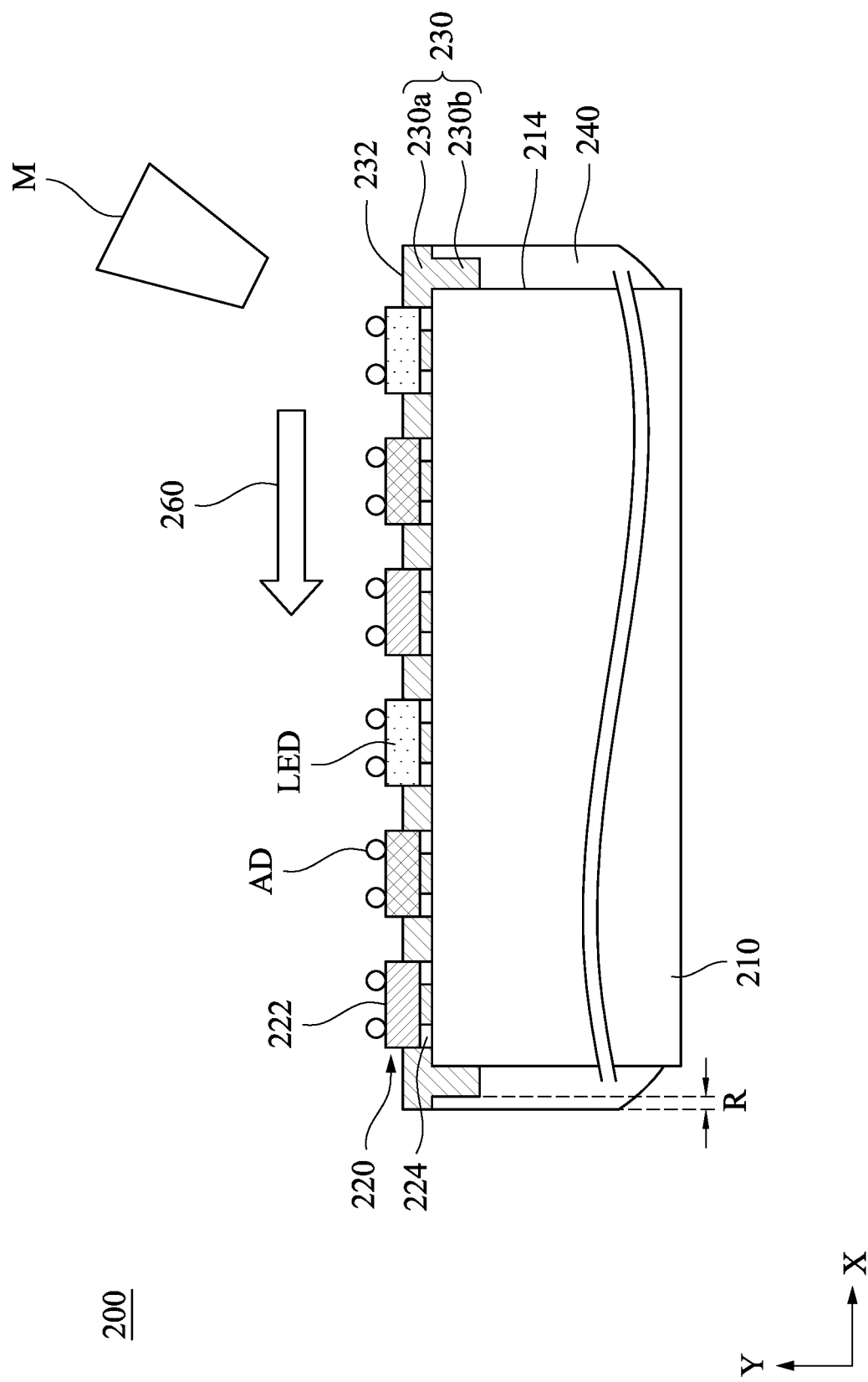
Figure 3:
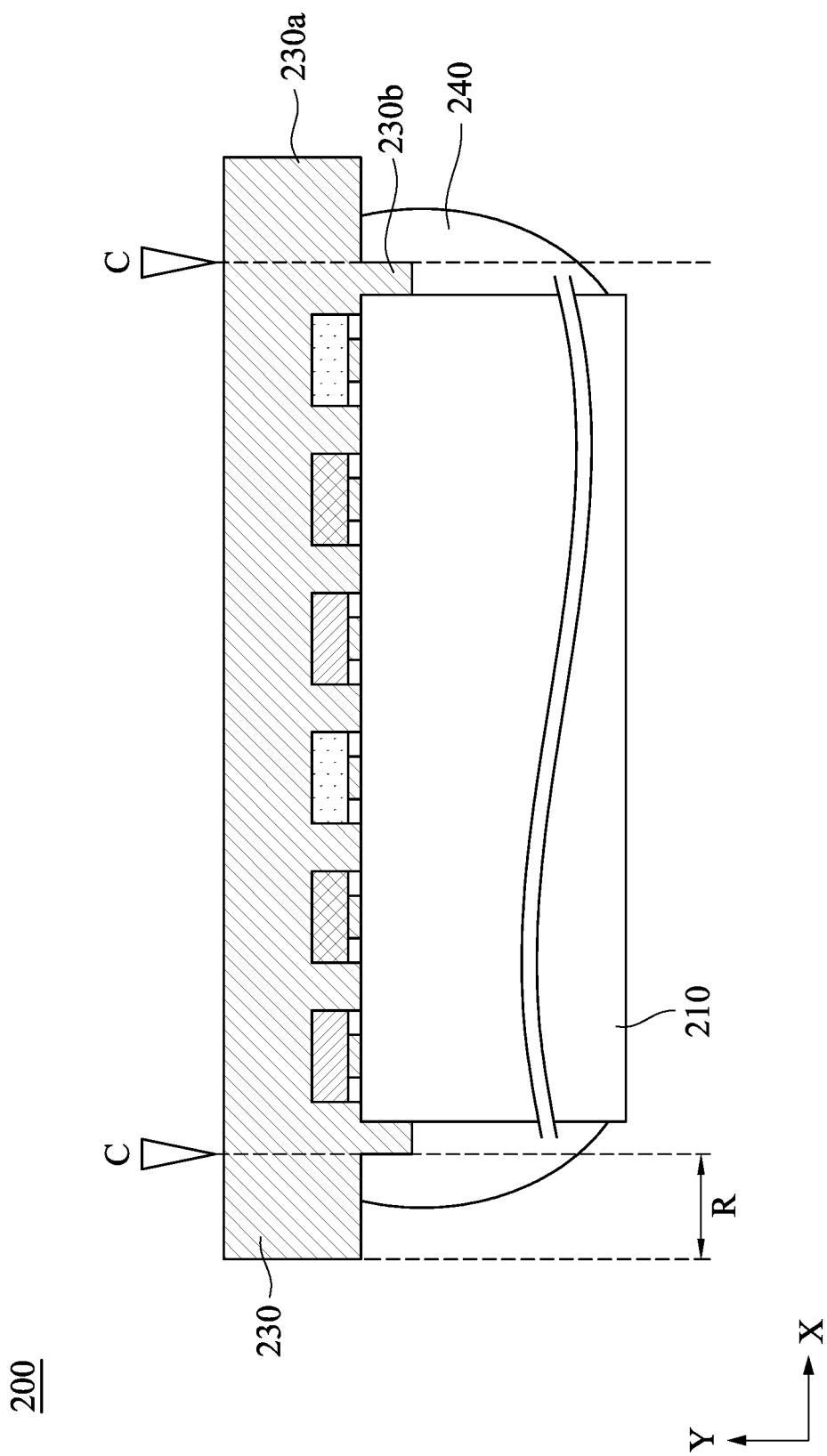
FIG. 3 is a cross-sectional view of an alternative embodiment in FIG. 2B to FIG. 2C.

Please refer to FIG. 3. FIG. 3 is a cross-sectional view of an alternative embodiment in FIG. 2B to FIG. 2C. The differences between FIG. 3 and FIG. 2C are the cutting positions (triangle signs V). The cutting positions in FIG. 3 show that the wing region R of the protruding portion of the main portion 230a of the first encapsulant 230 are cut, such that the main portion 230a of the first encapsulant 230 forms a coplanar surface in community with the extension portion 230b of the first encapsulant 230 and the sealant 240. Specifically, the coplanar surface is formed by the side surface of the main portion 230a of the first encapsulant 230, the side surface of the extension portion 230b of the first encapsulant 230, and the side surface of the sealant 240. After the cutting operation C, the sides of the first encapsulant 230 have n-shaped structures. On the one hand, since the main portion 230a and the extension portion 230b of the first encapsulant 230 contact the sealant 240 and form the coplanar surface together, the sealant 240 could provide good adhesion for the first encapsulant 230. On the other hand, removing the wing region R could prevent the sealant 240 and the first encapsulant 230 from peeling or degumming at the following dry cleaning operation (it will be discussed in FIG. 2E below).

Please refer to the operation 130 in FIG. 1 and FIG. 2D. An etching operation 250 is performed to mostly remove the first encapsulant 230 above the light emitting diode array 220. Specifically, most of the main portion 230a of the first encapsulant 230 are removed and a top surface 222 of the light emitting diode array 220 is mostly exposed (please refer to FIG. 2E), such that a height position of a top surface 232 of the main portion 230a of the first encapsulant 230 is lowered. In some embodiments, the etching operation 250 may be a dry etching operation, for example, a plasma etching.

Please refer to the operation 140 in FIG. 1 and FIG. 2E. A dry cleaning operation 260 is performed to completely remove an ashing portion AD of the first encapsulant 230 above the light emitting diode array 220 and expose the top surface 222 of the light emitting diode array 220. Specifically, after performing the etching operation 250 in FIG. 2D, the top surface 232 of the first encapsulant 230 is lowered to below the top surface 222 of the light emitting diode LED of the light emitting diode array 220, and a height position of the top surface 232 of the first encapsulant 230 is higher than a height position of a bonding pad 224 of the light emitting diode LED, as shown in FIG. 2E.

Figure 4:
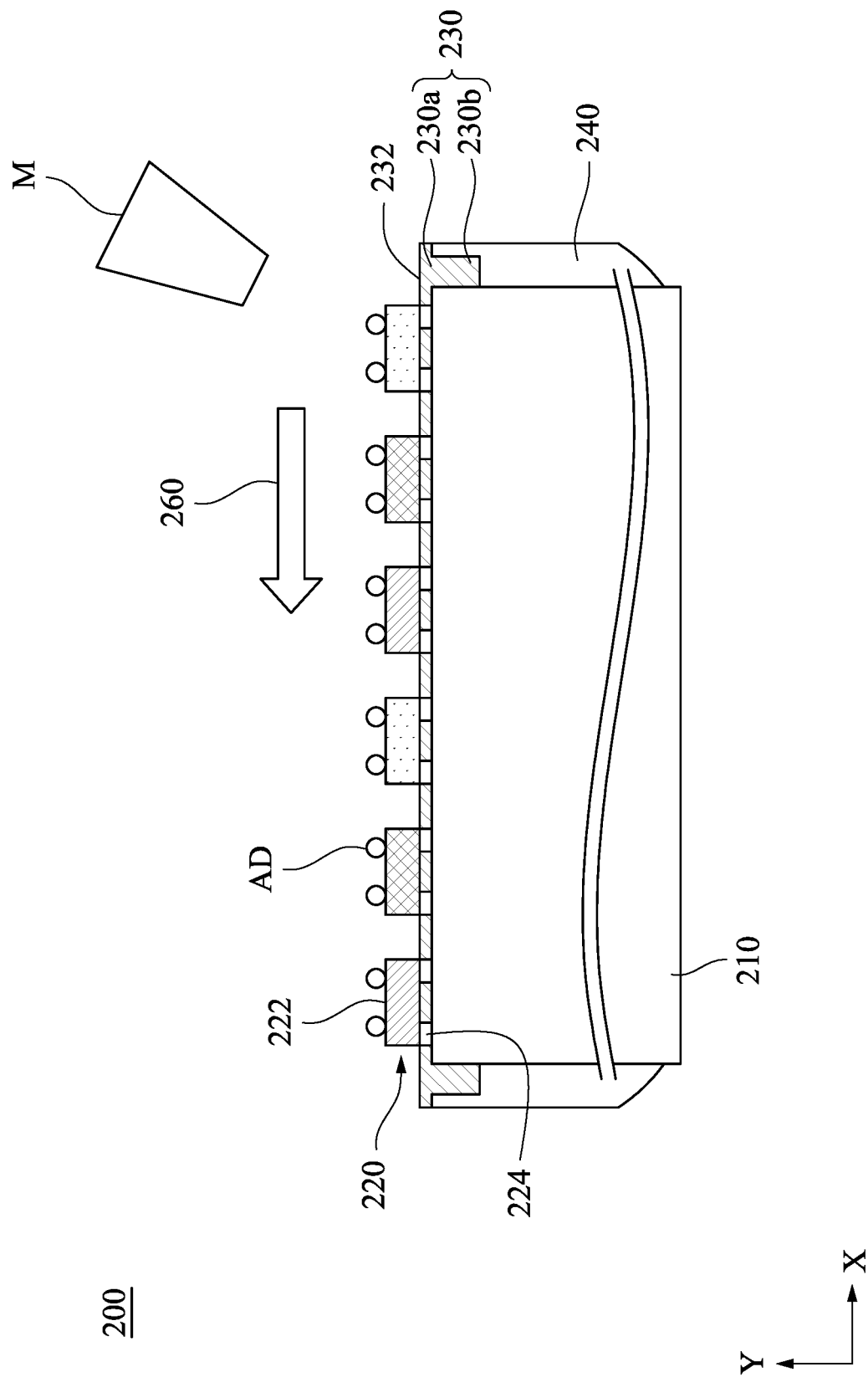
FIG. 4 is a cross-sectional view of an alternative embodiment in FIG. 2D to FIG. 2E.

Please refer to FIG. 4. FIG. 4 is a cross-sectional view of an alternative embodiment in FIG. 2D to FIG. 2E. After performing the etching operation 250 in FIG. 2D, the top surface 232 of the first encapsulant 230 is lowered to below the top surface 222 of the light emitting diode LED of the light emitting diode array 220, and the height position of the top surface 232 of the first encapsulant 230 is at the same level as the height position of the bonding pad 224 of the light emitting diode LED, as shown in FIG. 4. In some embodiments, the height position of the top surface 232 of the first encapsulant 230 may not lower than the height position of the bonding pad 224 of the light emitting diode LED.

Please refer to FIG. 2E again. The dry cleaning operation 260 is performed by a dry ice blasting assembly M. The dry ice blasting assembly M is configured to apply pressurized particles of dry ice ($CO_2$ snow) over the light emitting diode array 220 to clean and remove the ashing portion AD of the first encapsulant 230. Since the sealant 240 could provide good adhesion for the circuit substrate 210 and the first encapsulant 230, the degumming possibility in the wing region R would be reduced during performing the dry cleaning operation 260. In addition, the extension portion 230b of the first encapsulant 230 extends to the side surface 214 of the circuit substrate 210. Therefore, even though the wing region R may occur degumming to a small extent, the adhesive bonding among the circuit substrate 210, the light emitting diode array 220, and the first encapsulant 230 may not be affected. As a result, it could avoid damage to the display area (such as the light emitting diode array 220 region) of the package structure 200 because of the degumming between the circuit substrate 210 and the first encapsulant 230.

Figure 2F:
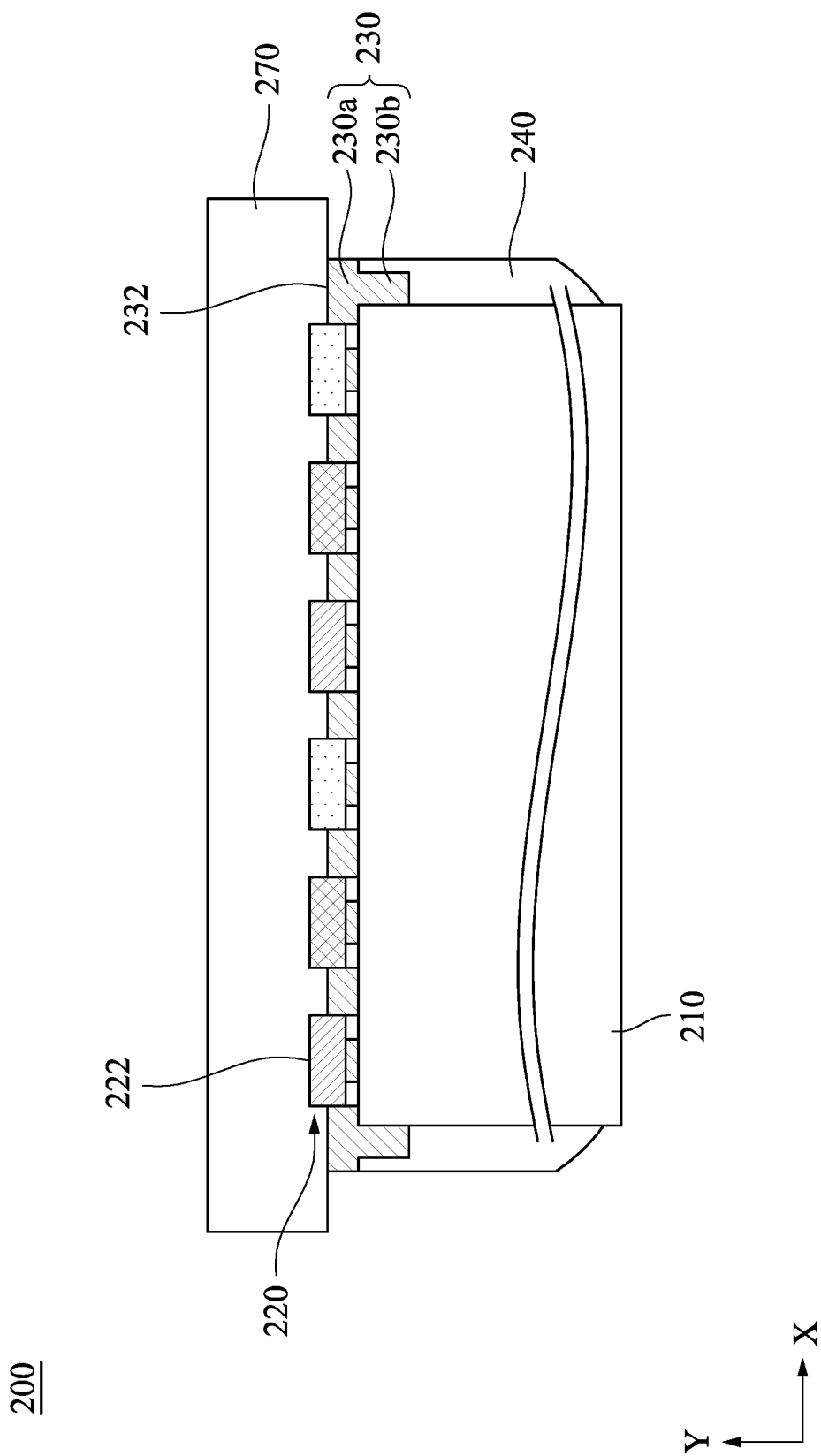

Please refer to the operation 150 in FIG. 1 and FIG. 2F. A second encapsulant 270 is formed on the light emitting diode array 220 and the first encapsulant 230 between the light emitting diode array 220. Specifically, the second encapsulant 270 covers the top surface 222 of the light emitting diode array 220 and the top surface 232 of the first encapsulant 230. In some embodiments, the second encapsulant 270 is a transparent encapsulant or an optical film, such as anti-reflection film. In some embodiments, the second encapsulant 270 may be disposed on the light emitting diode array 220 and the first encapsulant 230 by using a lamination process. In some embodiments, a material of the second encapsulant 270 may be the same or similar to that of the first encapsulant 230, in which the difference is that the second encapsulant 270 does not include black particles.

Figure 2G:
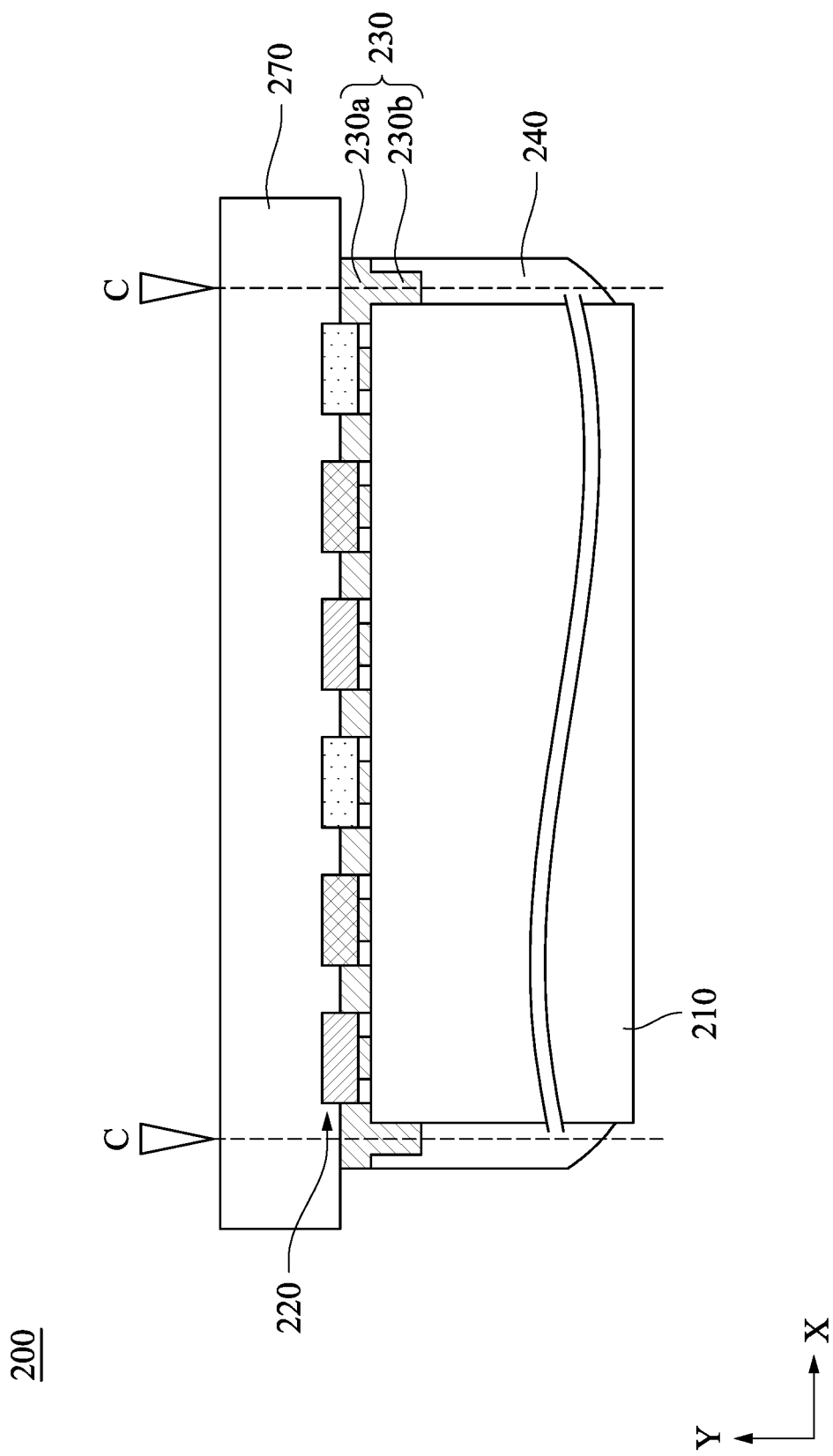

Still refer to FIG. 2F and FIG. 2G. After performing the operation 150 in FIG. 1, performing the cutting operation C such that the main portion 230a of the first encapsulant 230 forms a coplanar surface in community with the second encapsulant 270, the extension portion 230b of the first encapsulant 230, and the sealant 240, as shown in FIG. 2H.

Figure 5:
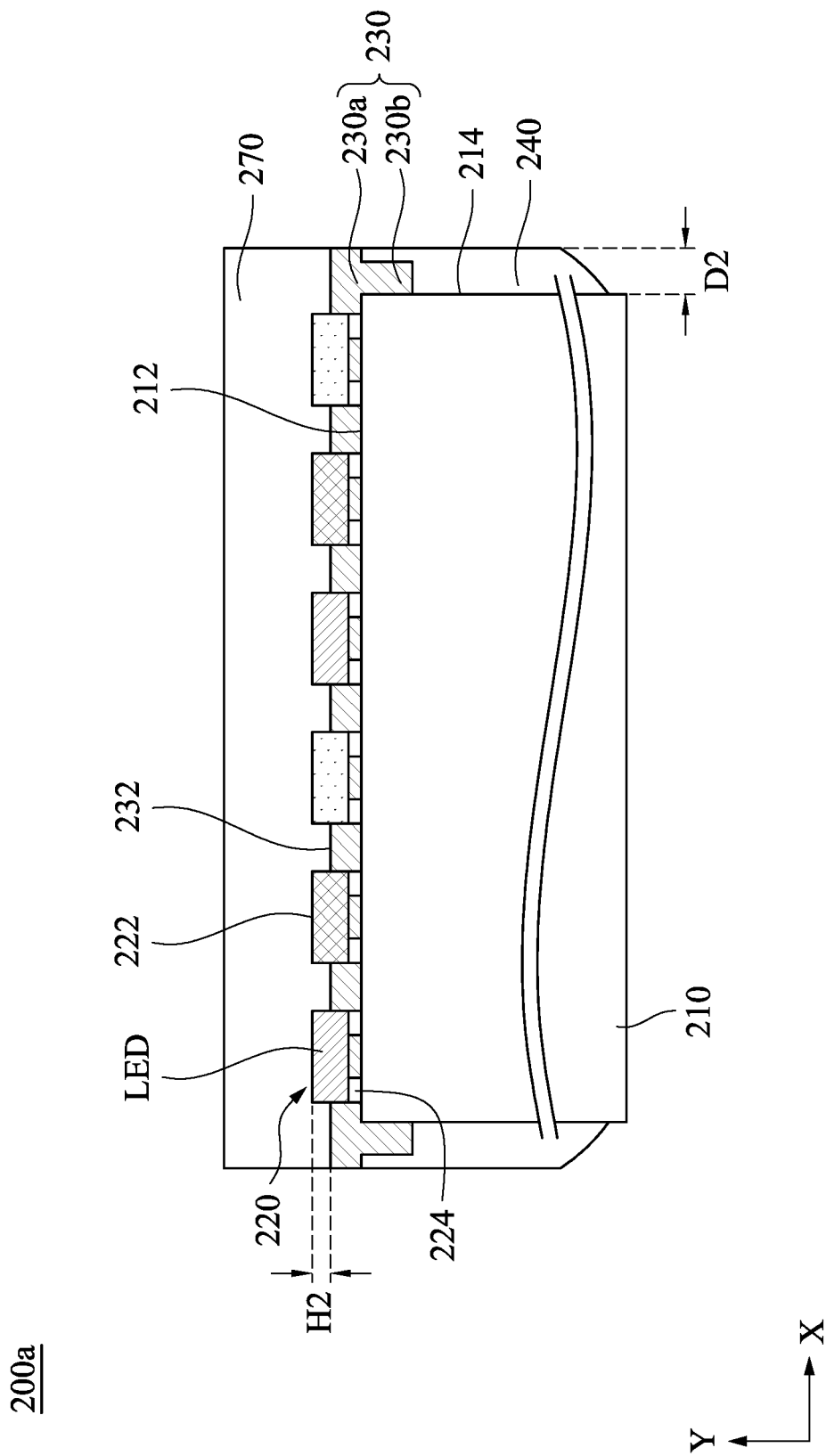
FIG. 5 is a cross-sectional view of an alternative embodiment in FIG. 2G to FIG. 2H.

Please refer to FIG. 5. FIG. 5 is a cross-sectional view of an alternative embodiment in FIG. 2G to FIG. 2H. The differences between the package structure 200 in FIG. 2H and the package structure 200a in FIG. 5 are the cutting positions (triangle signs V) in FIG. 2G. It is understood that the cutting positions in FIG. 2G may be determined according to the product requirements. If the cutting positions in FIG. 2G are widened along the direction X without cutting the extension portion 230b of the first encapsulant 230, such that the main portion 230a of the first encapsulant 230 forms the coplanar surface in community with the second encapsulant 270 and the sealant 240, as shown in FIG. 5. Specifically, the cutting coplanar surface is formed by the side surface of the second encapsulant 270, the side surface of the main portion 230a of the first encapsulant 230, and the side surface of the sealant 240. In other words, the sides of the first encapsulant 230 remain T-shaped structures after the cutting operation C.

Please refer to FIG. 2H again. The package structure 200 includes the circuit substrate 210, the light emitting diode array 220, the first encapsulant 230, the sealant 240, and the second encapsulant 270. The light emitting diode array 220 is disposed on the top surface 212 of the circuit substrate 210. The first encapsulant 230 is disposed above the circuit substrate 210, the main portion 230a of the first encapsulant 230 is disposed parallel to the top surface 212 of the circuit substrate 210, and the extension portion 230b of the first encapsulant 230 extends from the main portion 230a of the first encapsulant 230 to the side surface 214 of the circuit substrate 210. The first encapsulant 230 in FIG. 2H has a structure similar to an n-shape. The sealant 240 is disposed below the extension portion 230b of the first encapsulant 230. The sealant 240 contacts the first encapsulant 230 and the circuit substrate 210. The first encapsulant 230 is disposed between the second encapsulant 270 and the sealant 240, and the second encapsulant 270 does not contact the sealant 240. The second encapsulant 270 covers the light emitting diode array 220 and the first encapsulant 230.

Figure 2H:
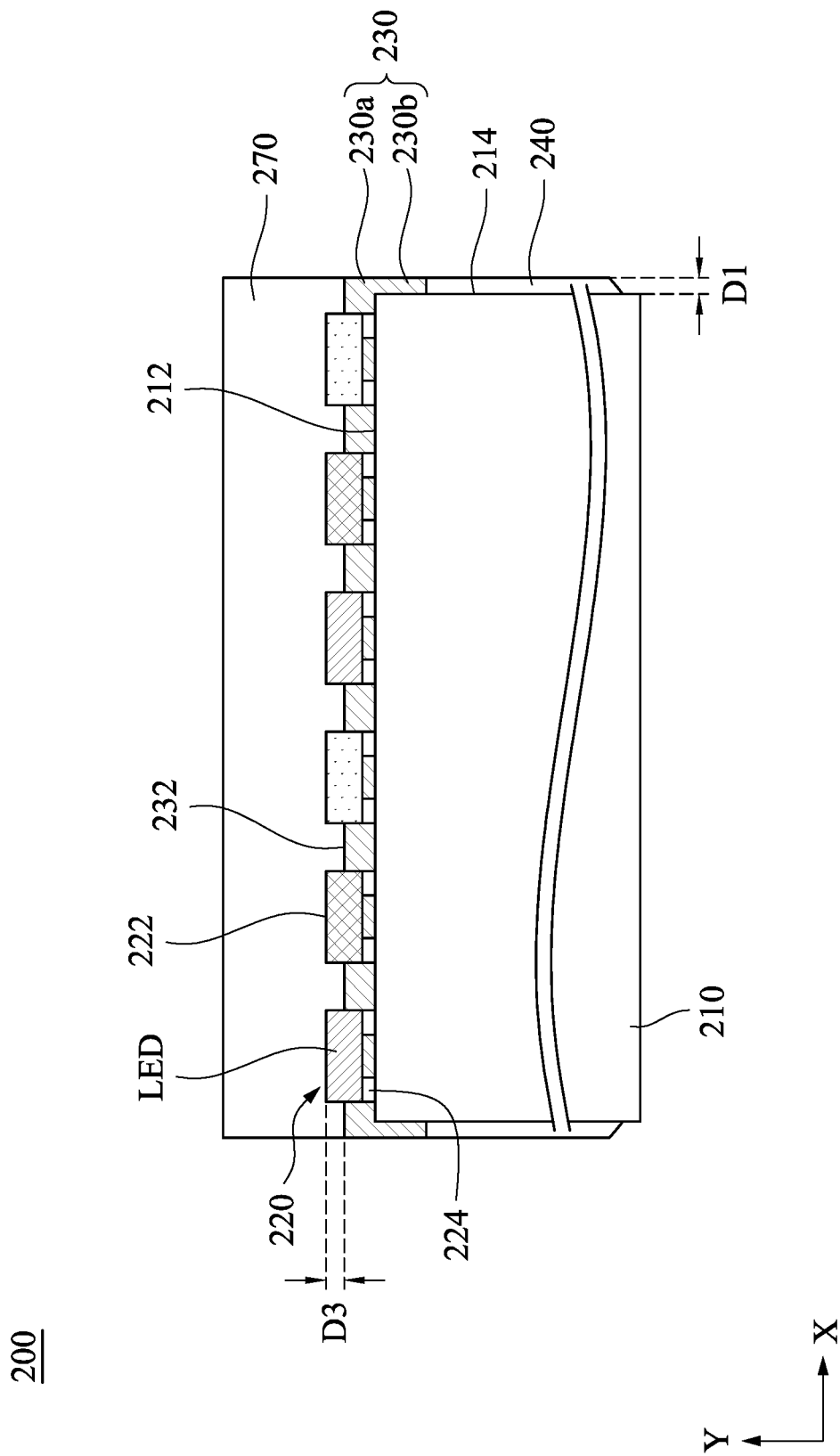

In the embodiment of FIG. 2H, the first encapsulant 230 forms the coplanar surface in community with the sealant 240. In other words, the main portion 230a of the first encapsulant 230, the extension portion 230b of the first encapsulant 230, and the sealant 240 together form the coplanar surface. In some embodiments, a distance D1 between the coplanar surface of the package structure 200 and the side surface 214 of the circuit substrate 210 is in a range from 5 μm to 15 μm, such as 8, 10, or 12 μm. In some embodiments, a distance D3 between the top surface 232 of the main portion 230a of the first encapsulant 230 and the top surface 222 of the light emitting diode LED is in a range from 5 μm to 10 μm, such as 6, 7, 8, or 9 μm. The distance D1 may be determined according to the product requirements in the following LEDs tiling (not shown in the present disclosure).

Please refer to FIG. 5 again. The differences between the package structure 200a in FIG. 5 and the package structure 200 in FIG. 2H are that sides of the first encapsulant 230 of the package structure 200a have T-shaped structures. In the embodiment of FIG. 5, the first encapsulant 230 forms the coplanar surface in community with the sealant 240. In other words, the main portion 230a of the first encapsulant 230 and the sealant 240 forms the coplanar surface. A distance D2 between the coplanar surface of the package structure 200a and the side surface 214 of the circuit substrate 210 is in a range from 45 μm to 55 μm, such as 48, 50, or 52 μm. The distance D2 may be determined according to the product requirements in the following LEDs tiling (not shown in the present disclosure). It should be understood that, in FIG. 2H and FIG. 5, the same or similar elements are given the same reference numerals, and the related descriptions are omitted and the details thereof are not repeatedly described.

Figure 6:
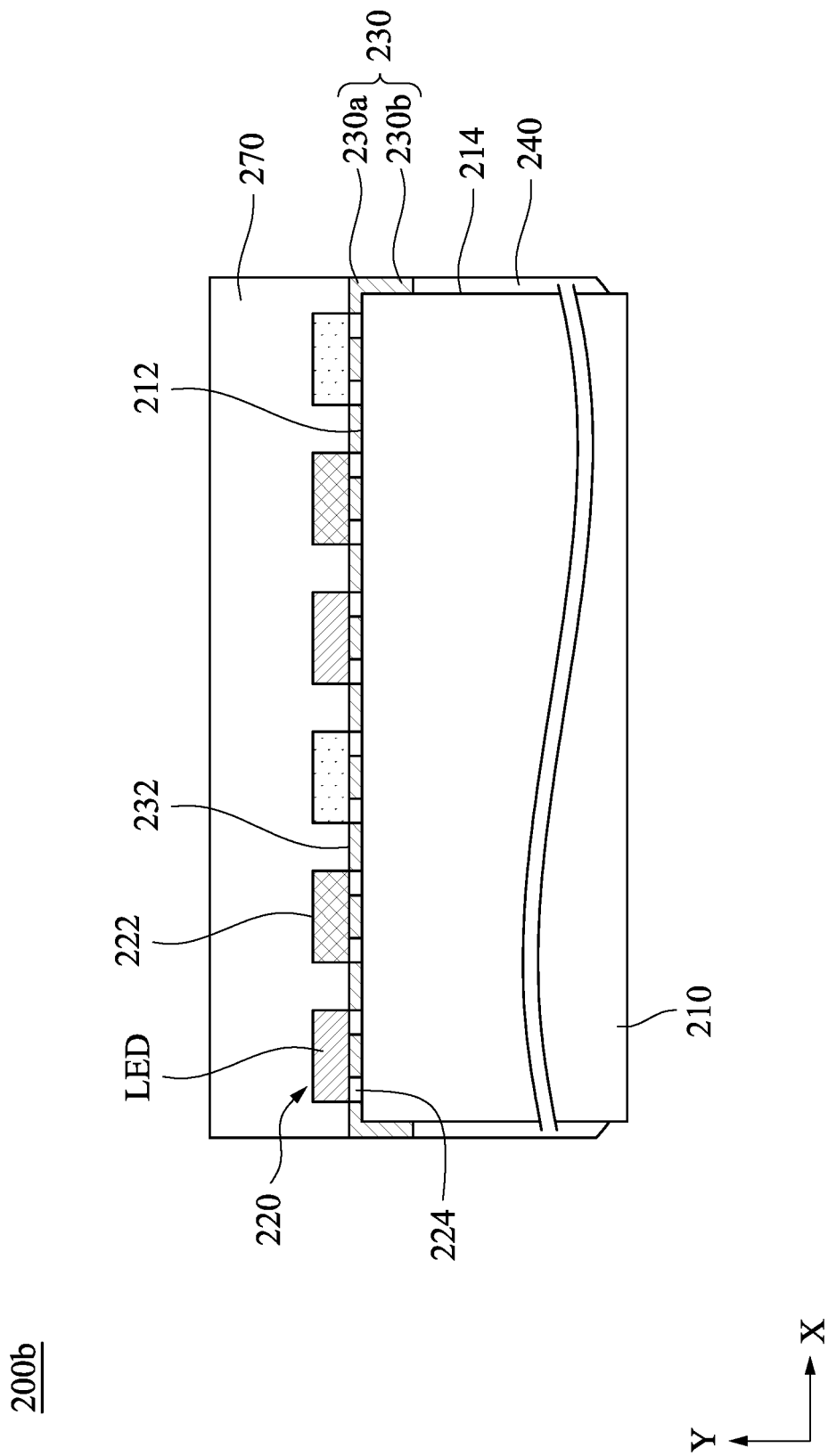
FIG. 6 to FIG. 7 are cross-sectional views of package structures in accordance with some alternative embodiments of the present disclosure.
Figure 7:
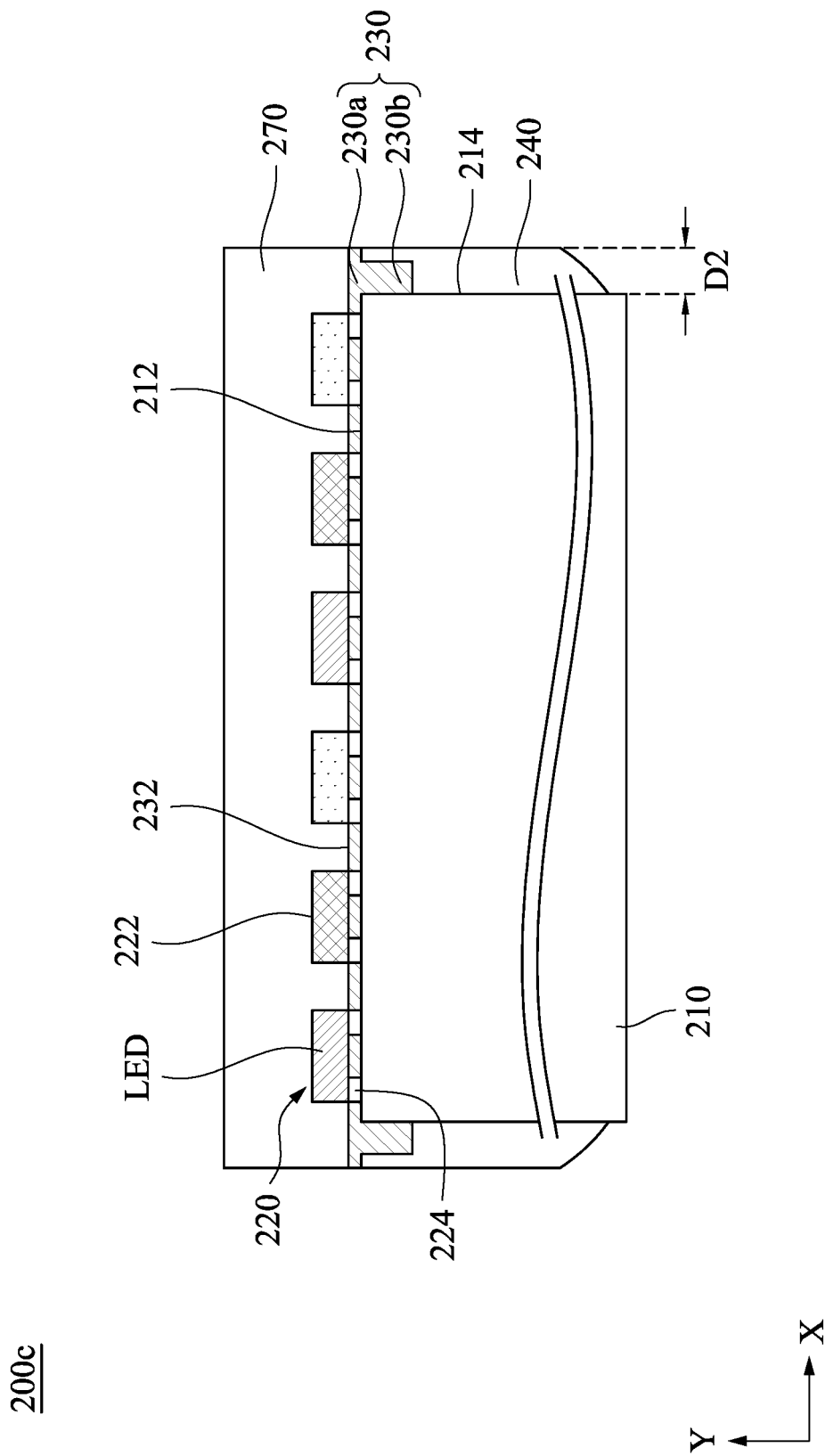

FIG. 6 and FIG. 7 are cross-sectional views of package structures 200b, 200c in accordance with some alternative embodiments of the present disclosure. The same or similar elements are given the same reference numerals, and the related descriptions are omitted and the details thereof are not repeatedly described.

Please refer to FIG. 6. The differences between the package structure 200b in FIG. 6 and the package structure 200 in FIG. 2H are the height positions of the top surface 232 of the main portions 230a of the first encapsulants 230. Specifically, after the package structure 200b undergoes the alternative embodiments in FIG. 4, the height position of the top surface 232 of the first encapsulant 230 is at the same level as the height position of the bonding pad 224 of the light emitting diode LED. After the cutting operation C in FIG. 2G, the package structure 200b in FIG. 6 is formed, in which the bonding pad 224 is between the light emitting diode LED of the light emitting diode array 220 and the circuit substrate 210, the height position of the main portion 230a of the first encapsulant 230 is substantially the same as the height position of the bonding pad 224.

Please refer to FIG. 7. The differences between the package structure 200c in FIG. 7 and the package structure 200a in FIG. 5 are the height positions of top surfaces 232 of the main portions 230a of the first encapsulants 230. The main portion 230a of the first encapsulant 230 forms the coplanar surface in community with the sealant 240, and the extension portion 230b of the first encapsulant 230 is between the coplanar surface and the side surface 214 of the circuit substrate 210.

As discussed above, the package structures of the present disclosure have the sealant (side sealant) surrounding the circuit substrate. The sealant provides good adhesion such that the circuit substrate and the first encapsulant are tightly bonded. The disclosed package structures would not occur degumming during manufacturing processes (for example, the etching and/or the cleaning operation), thereby avoiding the damage to the display area of the display panel because of the degumming (peeling) issue. Therefore, the disclosed first encapsulant of the package structures could be effectively removed from the surfaces of LEDs, and so LEDs could provide good luminous efficiency. Furthermore, the disclosed first encapsulant of the package structure has an extension portion extending to the side surface of the circuit substrate. This extension portion could further prevent the damage to the display area of the display panel caused by the degumming (peeling) of the circuit substrate and the first encapsulant.

The present disclosure has been disclosed as hereinabove, however it is not used to limit the present disclosure. Those skilled in the art may make various changes, substitutions, and alterations herein without departing from the spirit and scope of the present disclosure. Therefore, the scope of protection of the present disclosure shall be subject to the scope of the claim attached in the application and its equivalent constructions.

What is claimed is:

1. A package structure, comprising:
   a circuit substrate comprising a top surface and a side surface;
   a light emitting diode array disposed on the top surface of the circuit substrate;
   a first encapsulant disposed above the circuit substrate, wherein the first encapsulant comprises a main portion and an extension portion, the main portion is disposed parallel to the top surface, and the extension portion extends from the main portion to the side surface of the circuit substrate; and
   a sealant disposed below the extension portion of the first encapsulant, wherein the sealant contacts the first encapsulant and the circuit substrate, and the first encapsulant forms a coplanar surface in community with the sealant.

2. The package structure of claim 1, wherein the first encapsulant comprises 5~20 wt % of black particles.

3. The package structure of claim 1, wherein a cutting profile of the first encapsulant and a cutting profile of the sealant form a continuous structure on the coplanar surface.

4. The package structure of claim 1, wherein a material of the sealant comprises acrylic resin.

5. The package structure of claim 1, wherein an optical density of the sealant is greater than 3.

6. The package structure of claim 1, wherein the main portion of the first encapsulant forms the coplanar surface in community with the extension portion of the first encapsulant and the sealant.

7. The package structure of claim 1, wherein the main portion of the first encapsulant forms the coplanar surface in community with the sealant, and the extension portion of the first encapsulant is between the coplanar surface and the side surface of the circuit substrate.

8. The package structure of claim 1, further comprising a second encapsulant covering the light emitting diode array and the first encapsulant.

9. The package structure of claim 8, wherein the first encapsulant forms the coplanar surface in community with the sealant and the second encapsulant.

10. The package structure of claim 1, wherein a distance between the coplanar surface and the side surface of the circuit substrate is in a range from 5 µm to 15 µm.

11. The package structure of claim 1, wherein a distance between the coplanar surface and the side surface of the circuit substrate is in a range from 45 µm to 55 µm.

12. The package structure of claim 1, wherein the light emitting diode array comprises a light emitting diode, and a distance between a top surface of the main portion of the first encapsulant and a top surface of the light emitting diode is in a range from 5 µm to 10 µm.

13. The package structure of claim 1, wherein the light emitting diode array comprises a light emitting diode, the light emitting diode array comprises a bonding pad between the light emitting diode and the circuit substrate, and a height position of the main portion of the first encapsulant is substantially the same as a height position of the bonding pad.

14. A manufacturing method for a package structure, comprising:
    forming a first encapsulant on a circuit substrate and a light emitting diode array, wherein the light emitting diode array is disposed on the circuit substrate, the circuit substrate comprises a top surface and a side surface, the first encapsulant comprises a main portion and an extension portion, the main portion is disposed parallel to the top surface, and the extension portion extends from the main portion to the side surface of the circuit substrate;
    forming a sealant on the side surface of the circuit substrate, the sealant contacts the side surface of the circuit substrate and the extension portion of the first encapsulant;
    performing an etching operation to mostly remove the first encapsulant above the light emitting diode array;
    performing a dry cleaning operation to completely remove an ashing portion of the first encapsulant above the light emitting diode array and expose a top surface of the light emitting diode array; and
    forming a second encapsulant on the light emitting diode array and the first encapsulant, wherein the first encapsulant is between the light emitting diode array.

15. The manufacturing method for the package structure of claim 14, further comprising:
    performing a cutting operation after forming the sealant on the side surface of the circuit substrate, and thereby the main portion of the first encapsulant forms a coplanar surface in community with the sealant.

16. The manufacturing method for the package structure of claim 14, further comprising:
    performing a cutting operation after forming the sealant on the side surface of the circuit substrate, and thereby the main portion of the first encapsulant forms a coplanar surface in community with the extension portion of the first encapsulant, and the sealant.

17. The manufacturing method for the package structure of claim 14, further comprising:
    performing a cutting operation after forming the second encapsulant on the light emitting diode array and on the first encapsulant between the light emitting diode array, and thereby the main portion of the first encapsulant forms a coplanar surface in community with the second encapsulant, the extension portion of the first encapsulant, and the sealant.

18. The manufacturing method for the package structure of claim 14, further comprising:
- performing a cutting operation after forming the second encapsulant on the light emitting diode array and on the first encapsulant between the light emitting diode array, and thereby the main portion of the first encapsulant forms a coplanar surface in community with the second encapsulant, and the sealant.

19. The manufacturing method for the package structure of claim 14, wherein the first encapsulant comprises 5~20 wt % of black particles.

20. The manufacturing method for the package structure of claim 14, wherein an optical density of the sealant is greater than 3.

* * * * *